(12) United States Patent
Jongbloed et al.

(10) Patent No.: US 9,711,351 B2
(45) Date of Patent: Jul. 18, 2017

(54) PROCESS FOR DENSIFYING NITRIDE FILM

(71) Applicant: ASM IP Holding B.V., Almere (NL)

(72) Inventors: Bert Jongbloed, Oud-Heverlee (BE); Dieter Pierreux, Dilbeek (BE)

(73) Assignee: ASM IP HOLDING B.V. (NL)

( * ) Notice: Subject to any disclaimer, the term of this patent is extended or adjusted under 35 U.S.C. 154(b) by 0 days.

(21) Appl. No.: 14/830,455

(22) Filed: Aug. 19, 2015

(65) Prior Publication Data

US 2016/0079058 A1    Mar. 17, 2016

Related U.S. Application Data

(60) Provisional application No. 62/049,224, filed on Sep. 11, 2014.

(51) Int. Cl.
*H01L 21/02*    (2006.01)
*H01L 21/3105*    (2006.01)

(52) U.S. Cl.
CPC .... *H01L 21/02337* (2013.01); *H01L 21/0217* (2013.01); *H01L 21/02274* (2013.01); *H01L 21/3105* (2013.01)

(58) Field of Classification Search
None
See application file for complete search history.

(56) References Cited

U.S. PATENT DOCUMENTS

| | | | | |
|---|---|---|---|---|
| 4,331,710 A * | 5/1982 | Nozaki | ............... | H01L 21/3185 148/DIG. 112 |
| 6,319,766 B1 * | 11/2001 | Bakli | .................. | C23C 16/0281 257/E21.274 |
| 6,348,420 B1 * | 2/2002 | Raaijmakers | ........... | C23C 16/44 257/E21.191 |
| 6,391,738 B2 * | 5/2002 | Moore | ............. | H01L 21/76224 257/E21.318 |
| 6,491,978 B1 * | 12/2002 | Kalyanam | ............... | C23C 16/18 257/E21.17 |
| 6,818,517 B1 * | 11/2004 | Maes | .................... | C23C 16/345 257/E21.279 |
| 8,771,585 B2 * | 7/2014 | Shen | ................... | C04B 35/5626 264/683 |
| 2003/0186494 A1 * | 10/2003 | Rantala | ............. | H01L 21/02126 438/200 |
| 2005/0124121 A1 * | 6/2005 | Rotondaro | .............. | C23C 16/56 438/287 |
| 2006/0270217 A1 * | 11/2006 | Balseanu | ............. | C23C 16/345 438/653 |
| 2007/0077777 A1 * | 4/2007 | Gumpher | ............. | C23C 16/308 438/778 |
| 2009/0035917 A1 * | 2/2009 | Ahn | ................... | H01L 21/02164 438/425 |

(Continued)

*Primary Examiner* — Michael Lebentritt
*Assistant Examiner* — Jordan Klein
(74) *Attorney, Agent, or Firm* — Knobbe, Martens, Olson & Bear LLP

(57) ABSTRACT

In some embodiments, a nitride film is provided over a semiconductor substrate and densified. The nitride film may be a flowable nitride, which may be deposited to at least partially fill openings in the substrate. Densifying the film is accomplished without exposing the nitride film to plasma by exposing the nitride film to a non-plasma densifying agent in the process chamber. The non-plasma densifying agent may be a nitriding gas, a hydrogen scavenging gas, a silicon precursor, or a combination thereof.

30 Claims, 1 Drawing Sheet

(56) References Cited

U.S. PATENT DOCUMENTS

| | | | |
|---|---|---|---|
| 2009/0068816 A1* | 3/2009 | Eun | H01L 21/76232 438/425 |
| 2009/0068817 A1* | 3/2009 | Eun | H01L 21/76232 438/425 |
| 2011/0212620 A1* | 9/2011 | Liang | H01L 21/02164 438/692 |
| 2013/0203266 A1* | 8/2013 | Hintze | H01L 21/32051 438/763 |
| 2013/0288485 A1* | 10/2013 | Liang | H01L 21/02282 438/782 |
| 2014/0073144 A1* | 3/2014 | Chatterjee | H01L 21/02274 438/793 |

* cited by examiner

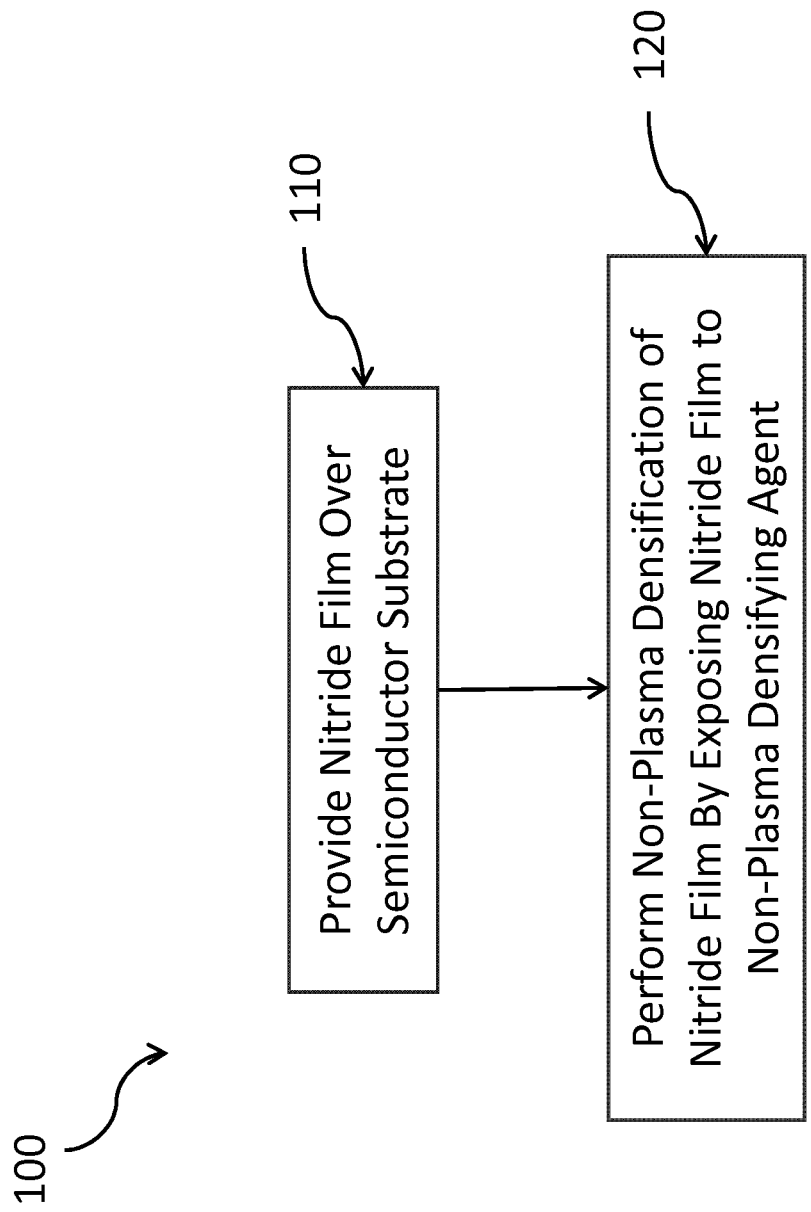

PROCESS FOR DENSIFYING NITRIDE FILM

REFERENCE TO RELATED APPLICATION

This application claims the priority benefit of provisional Application No. 62/049,224, filed Sep. 11, 2014, the entire disclosure of which is incorporated herein by reference.

FIELD

This disclosure relates to semiconductor processing and, more particularly, to processes for densifying nitride films.

BACKGROUND

Semiconductor processing, such as for forming integrated circuits, commonly includes filling openings in a substrate with a dielectric material, such as a nitride. As the dimensions of semiconductor devices in integrated circuits become ever smaller, these openings have also become smaller and more difficult to fill without forming voids in the deposited fill. Consequently, there is a continuing need for methods for filling openings with dielectric material, while reducing the occurrence of voids and also providing desired dielectric properties, such as high density and hardness.

SUMMARY

Some embodiments relate to a method for semiconductor processing. A nitride film is provided over a semiconductor substrate in a process chamber. The nitride film is densified without exposing the nitride film to plasma by exposing the nitride film to a non-plasma densifying agent in the process chamber. In some embodiments, the non-plasma densifying agent is selected from the group consisting of a nitriding gas, a hydrogen scavenging gas, a silicon precursor, and combinations thereof. In some embodiments, the nitride film is a flowable nitride film.

BRIEF DESCRIPTION OF THE DRAWING

FIG. 1 is a flow chart generally illustrating a process for densifying a nitride film, according to some embodiments.

DETAILED DESCRIPTION

It will be appreciated that filling an opening in a substrate with a dielectric, such as a nitride, may be accomplished by depositing a layer of the nitride on the top surface of the substrate and on side and bottom surfaces of the opening, with the layer filling in the opening from the sides and bottom as it grows. Small openings, however, are prone to having the deposited layer pinch off, or close, the top of the openings before the interior of the openings are completely filled. As a result, voids may be formed in the deposited nitride fill.

One strategy for reducing the occurrence of voids is to fill the openings with a flowable nitride. The flowable nitride may be deposited with a flowable precursor and/or the nitride may be flowable after being deposited, which can allow the precursors and/or nitride to flow into openings and provide void-free or substantially void-free filling of the openings. As used herein, it will be appreciated that "and/or" means that only one of the listed items or all of the listed times are indicated. For example, "A and/or B" means that A and B together, A alone, and B alone are contemplated.

In some embodiments, a nitride film is provided over a semiconductor substrate and densified. Densifying the film is accomplished without exposing the nitride film to plasma by exposing the nitride film to a non-plasma densifying agent in the process chamber. The non-plasma densifying agent may be a nitriding gas, a hydrogen scavenging gas, a silicon precursor, or a combination thereof in some embodiments. The nitride film may be a flowable nitride. In some embodiments, the substrate includes one or more openings and providing the nitride film may include depositing the film to at least partially fill the openings.

Advantageously, in some embodiments, substantially gap-free filling of the openings maybe achieved while also providing a nitride fill with desired dielectric properties, including a high density and hardness. In addition, the absence of a plasma during densification allows for a uniform densification result as it has been found that a non-plasma densifying agent is capable of penetrating more deeply into the openings than a densifying agent that is activated by a plasma.

Reference will now be made to the FIGURE.

FIG. 1 is a flow chart generally illustrating a process 100 for curing a nitride film, according to some embodiments. At block 110, the nitride film is provided over a semiconductor substrate in a process chamber. As used herein, it will be appreciated that a semiconductor substrate is a substrate that is at least partially formed of semiconductor material. For example, in some embodiments, the semiconductor substrate may be a semiconductor wafer, or may be a semiconductor wafer having overlying conductive and/or dielectric materials.

Providing the nitride film may include depositing the nitride film over the semiconductor substrate in a nitride film deposition chamber. In some embodiments, the substrate may have openings in it and depositing the nitride film may include at least partially filling the openings with the nitride film. In some embodiments, the nitride film is a flowable nitride film, which may advantageously provide substantially void-free fill of openings. The flowable nitride film may be formed using a silicon precursor, which is reacted with a nitrogen precursor to form the nitride film. In some embodiments, the flowable nitride film is formed by chemical vapor deposition using the silicon precursor in non-plasma form and the nitrogen precursor in the form of a nitrogen plasma. The nitrogen precursor may be flowed through a remote plasma generator to generate the nitrogen plasma before entering the deposition chamber, while the silicon precursor is provided to the substrate without plasma activation, in a non-plasma state. In some embodiments, the silicon precursor may be free of carbon and oxygen, which can facilitate the formation of nitride films with high density and low shrinkage after being densified. The silicon precursor may also include nitrogen in some embodiments. An example of a suitable silicon precursor is tri-silyl amine (TSA, $N(SiH_3)_3$). Other silyl-amines or amino-silanes may also be used, including, for example, $H_2N(SiH_3)$ and $HN(SiH_3)_2$. Examples of suitable nitrogen precursors include $NH_3$, $N_2H_4$.

With continued reference to FIG. 1, at block 120, the nitride film is densified in a non-plasma densification by being exposed to a non-plasma densifying agent. In some embodiments, the densifying agent may chemically react with the nitride film, e.g., to increase crosslinking of chemical species forming the nitride film by removing some chemical species (e.g., hydrogen species) to facilitate the crosslinking and/or by being directly incorporated into the nitride film itself. The exposure to the densifying agent may cure the nitride film in some embodiments.

In some embodiments, the exposure to the densifying agent is performed in the deposition chamber used to deposit the nitride film. In such arrangements, the deposition chamber for depositing the nitride film and the process chamber for the exposure to the densifying agent are the same, and chemical species for the deposition may be removed from the chamber before the exposure to the densifying agent. The chemical species for the deposition may be removed by evacuation and/or purging of the chamber with an inert gas.

In some other embodiments, the substrate with the nitride film is removed from the deposition chamber and then loaded into a process chamber for the exposure to the densifying agent. It will be appreciated that the nitride film may be susceptible to oxidation during unloading from the deposition chamber and/or loading into the process chamber for curing. In some embodiments, a reducing or inert gas ambient may be established around the substrate during unloading from the deposition chamber and/or loading into the process chamber for curing. For example, gas including a reducing species such as hydrogen gas (e.g. forming gas, 4% $H_2$ in $N_2$) may be flowed through the process chamber during the loading process to establish a reducing ambient in that chamber. As another example, alternatively, inert gas maybe flowed into the process chamber to establish a reducing ambient in that chamber during loading.

In some embodiments, the process chamber for curing the nitride film may be a batch process chamber, which may be configured to accommodate 20 or more, 50 or more, or 100 or more semiconductor substrates. In some other embodiments, a process chamber configured to accommodate a smaller number of substrates; for example, a single substrate process chamber may be utilized.

After being loaded into the process chamber, the nitride film on the substrate may be subjected to a non-plasma based densification in which the substrate is not exposed to plasma during the densification. The densification proceeds by exposing the nitride film to a non-plasma densifying agent. The non-plasma densifying agent may be a nitriding gas, a hydrogen scavenging gas, a silicon precursor, or a combination thereof. Examples of nitriding gases include $NH_3$, $N_2H_4$, and combinations thereof. Examples of hydrogen scavenging gases include $Cl_2$, $C_2H_2$, $C_2H_4$, and combinations thereof. Examples of silicon precursors include silane, disilane, trisilane, chlorosilanes, and combinations thereof. Preferably, the densifying agent is flowed into the process chamber as a gas.

In some embodiments, the nitride film may be exposed to a single one of a nitriding gas, a hydrogen scavenging gas, or a silicon precursor. In some other embodiments, the nitride film may be exposed to two or more of a nitriding gas, a hydrogen scavenging gas, and a silicon precursor during the densification, e.g., the substrate may be exposed to each gas sequentially at different times. For example, the nitride film may be exposed to alternating, temporally-separated exposures of a first densifying gas and a second densifying gas that is different from the first densifying gas. Each of the first and second densifying gases may be a different gas selected from the group consisting of a nitriding gas, a hydrogen scavenging gas, and a silicon-containing gas (e.g., a silicon precursor gas). For example, the first densifying gas may be a nitriding gas and the second densifying gas may be a silicon-containing gas. In some other embodiments, at least one of the first densifying gas or the second densifying gas is a combination of two or more gases selected from the group consisting of a nitriding gas, a hydrogen scavenging gas, and a silicon gas.

It will be appreciated that the process temperature during the exposure to the densifying agent can influence curing results. In some embodiments, the process temperature may be in a range from about 200° C. to about 600° C. In some other embodiments, the process temperature may increase over time. For example, the cure may be performed at multiple process temperature set points. In some embodiments, the nitride film may be exposed to a densifying agent at a first process temperature of less than about 400° C., and the process temperature may then be increased to a second process temperature, which may be greater than about 400° C. At the second temperature, the nitride film may also be exposed a densifying agent.

In some other embodiments, the first process temperature may be in a range from about 200° C. to about 400° C., and the second process temperature may be in a range from about 300° C. to about 600° C. In such embodiments, the first process temperature may be less than the second process temperature.

The nitride film may be exposed to the same densifying agent at both of the first and the second process temperatures. In some other embodiments, the nitride film may be exposed to different ones of the non-plasma nitriding gas or the non-plasma hydrogen scavenging gas, depending upon the process temperature utilized. In some embodiments, the substrate may be maintained at each of the first and second temperatures for a period of time, e.g., ranging from about 5 minutes to about 2 hours In some embodiments, rather than a large jump in temperature, the process temperature may be increased gradually over time, e.g., from about 300° C. to about 400° C. or higher. In some embodiments, the process temperature is increased continuously from about 300° C. to about 400° C. or higher. In some cases, the increase can include increasing the temperature set point of the process chamber gradually over time, in a large number of small steps, such that the increases in the set point do not exceed, e.g., about 5° C., or about 1° C. In some other embodiments, the process temperature is increased in steps of about 50° C. or less, e.g., steps of about 10° C. to about 50° C.

In some embodiments, where the densifying agent is a silicon precursor, the substrate may be subjected to a silicon precursor soak at process temperature of about 600° C. or less, about 500° C. or less, about 400° C. or less, or about 300° C., including about 400° C. to about 200° C., or about 350° C. to about 200° C. The nitride film may be exposed to the silicon precursor for a duration of about 5 minutes to about 2 hours. Examples of suitable flow rates of silicon precursor gas into the process chamber include 0.1-2 slm. Examples of suitable pressures include about 10 mTorr to about 100 Torr. In some embodiments, the pressure may be ramped up over time. For example, the nitride film may be exposed to silicon precursor at a first relatively low pressure, and then the pressure may be increased to a second relatively high pressure for further exposure to silicon precursor. In addition, as noted herein, the process temperature may be maintained constant throughout the exposure the densifying agent, or may be varied, e.g., increased, over time.

It will be appreciated that, during a densification, the nitride film may be continuously exposed to a densifying agent. In some other embodiments, the exposure to the densifying agent may by cyclic; the nitride film may be subjected to temporally-separated exposures to the densifying agent. In between exposures, process gas inside the process chamber may be removed, e.g., by purging with inert gas and/or by evacuation. Advantageously, the process gas removal may aid the cure by facilitating the removal of chemical species from the nitride film. For example, hydrogen species removed from the nitride film by reaction with the densifying agent may be removed in turn from the process chamber by the process gas removal. The process gas removal can advantageously reduce a concentration of the hydrogen species in the process chamber, thereby facilitating further removal of hydrogen species from the nitride film.

It will be appreciated that various modifications and refinements to the embodiments disclosed herein may be made. For example, while advantageously applied to flowable nitrides for filling openings, it will be appreciated that the methods disclosed herein may be applied to cure nitride films generally, and are not limited to flowable nitrides for filling openings.

Accordingly, it will be appreciated by those skilled in the art that various omissions, additions and modifications can be made to the processes and structures described above without departing from the scope of the invention. It is contemplated that various combinations or sub-combinations of the specific features and aspects of the embodiments may be made and still fall within the scope of the description. Various features and aspects of the disclosed embodiments can be combined with, or substituted for, one another in order. All such modifications and changes are intended to fall within the scope of the invention, as defined by the appended claims.

What is claimed is:

1. A method for semiconductor processing, comprising:
   providing a nitride film over a semiconductor substrate in a process chamber; wherein the nitride film is formed without utilizing an oxygen-containing precursor; and
   densifying the nitride film without exposing the nitride film to plasma by exposing the nitride film to a non-plasma densifying agent in the process chamber, wherein exposing the nitride film comprises:
      subjecting the nitride film to exposure to non-plasma densifying agent at a first process temperature of less than about 400° C.; and
      subsequently subjecting the nitride film to exposure to non-plasma densifying agent at a second process temperature higher than the first process temperature and greater than about 400° C.

2. The method of claim 1, wherein the non-plasma densifying agent is selected from the group consisting of a nitriding gas, a hydrogen scavenging gas, a silicon precursor, and combinations thereof.

3. The method of claim 2, wherein the nitriding gas is selected from the group consisting of $NH_3$, $N_2H_4$, and combinations thereof.

4. The method of claim 2, wherein the hydrogen scavenging gas is selected from the group consisting of $Cl_2$, $C_2H_2$, $C_2H_4$, and combinations thereof.

5. The method of claim 2, wherein the silicon precursor is selected from the group consisting of silane, disilane, trisilane, chlorosilanes, and combinations thereof.

6. The method of claim 1, wherein exposing the nitride film is performed at a process temperature in a range of about 200° C. to about 600° C.

7. The method of claim 1, wherein the nitride film is subjected to exposure to a same non-plasma densifying agent at both the first and the second process temperatures.

8. The method of claim 1, further comprising increasing a process temperature from about 300° C. or less to about 400° C. or more during exposing the nitride film.

9. The method of claim 8, wherein increasing the process temperature comprises continuously increasing the process temperature.

10. The method of claim 8, wherein increasing the process temperature comprises stepwise increases in the process temperature.

11. The method of claim 10, wherein increasing the process temperature occurs in steps of about 50° C. or less.

12. The method of claim 1, wherein exposing the nitride film comprises evacuating the process chamber between a plurality of temporally separated exposures to non-plasma densifying agent.

13. The method of claim 1, wherein exposing the nitride film to the non-plasma densifying agent cures the nitride film.

14. The method of claim 1, wherein the nitride film is a flowable nitride film.

15. The method of claim 14, wherein providing the nitride film comprises depositing the flowable nitride film.

16. The method of claim 15, wherein depositing the flowable nitride film is performed in the process chamber.

17. A method for semiconductor processing, comprising:
   providing a nitride film over a semiconductor substrate in a process chamber; wherein the nitride film is formed without utilizing an oxygen-containing precursor; and
   densifying the nitride film without exposing the nitride film to plasma by exposing the nitride film to a non-plasma densifying agent in the process chamber, wherein exposing the nitride film comprises:
      subjecting the nitride film to exposure to non-plasma densifying agent at a first process temperature in a range of about 200° C. to about 400° C.; and
      subsequently subjecting the nitride film to exposure to non-plasma densifying agent at a second process temperature higher than the first process temperature and in a range of about 300° C. to about 600° C.

18. The method of claim 17, wherein the nitride film is subjected to exposure to a same non-plasma densifying agent at both the first and the second process temperatures.

19. A method for semiconductor processing, comprising:
   providing a nitride film over a semiconductor substrate in a process chamber; wherein the nitride film is formed without utilizing an oxygen-containing precursor; and
   densifying the nitride film without exposing the nitride film to plasma by exposing the nitride film to a non-plasma densifying agent in the process chamber,
   further comprising depositing the nitride film on the semiconductor substrate in a nitride film deposition chamber, wherein providing the nitride film over the semiconductor substrate in the process chamber comprises:
   removing the semiconductor substrate from the deposition chamber after depositing the nitride film; and
   subsequently loading the semiconductor substrate into the process chamber.

20. The method of claim 19, further comprising establishing a reducing gas ambient around the semiconductor substrate while loading the semiconductor substrate into the process chamber.

21. The method of claim 20, wherein the reducing gas comprises hydrogen gas.

22. The method of claim 19, further comprising establishing an inert gas ambient around the semiconductor substrate while loading the semiconductor substrate into the process chamber.

23. The method of claim 22, wherein the inert gas is selected from the group consisting of argon gas, helium gas, nitrogen gas, and combinations thereof.

24. The method of claim 1, wherein exposing the nitride film to at least one of a non-plasma nitriding gas or a non-plasma hydrogen scavenging gas comprises subjecting the nitride film to a plurality of temporally-separated exposures to the at least one of a non-plasma nitriding gas or a non-plasma hydrogen scavenging gas.

25. The method of claim 24, further comprising removing process gas from the process chamber between the temporally-separated exposures.

26. The method of claim 25, wherein removing process gas comprises purging the process chamber with inert gas.

27. The method of claim 24, wherein exposing the nitride film comprises exposing the nitride film to alternating, temporally-separated exposures of a first densifying gas and a second densifying gas, the second densifying gas being different from the first densifying gas.

28. The method of claim 27, wherein each of the first and second densifying gases is a different one selected from the group consisting of a nitriding gas, a hydrogen scavenging gas, and a silicon-containing gas.

29. The method of claim 28, wherein the first densifying gas is a nitriding gas and the second densifying gas is a silicon-containing gas.

30. The method of claim 27, wherein at least one of the first or the second densifying gas is a combination of two or more of a nitriding gas, a hydrogen scavenging gas, and a silicon gas.

* * * * *